(12) United States Patent
Yamasaki et al.

(10) Patent No.: US 7,131,086 B2
(45) Date of Patent: Oct. 31, 2006

(54) LOGIC VERIFICATION DEVICE, LOGIC VERIFICATION METHOD AND LOGIC VERIFICATION COMPUTER PROGRAM

(75) Inventors: Junya Yamasaki, Kawasaki (JP); Sumiko Maeda, Kawasaki (JP); Kenya Takeyama, Kawasaki (JP); Yukio Makino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 104 days.

(21) Appl. No.: 10/915,608

(22) Filed: Aug. 11, 2004

(65) Prior Publication Data

US 2005/0229122 A1    Oct. 13, 2005

(30) Foreign Application Priority Data

Mar. 30, 2004  (JP)  ............................. 2004-098221

(51) Int. Cl.
*G06F 17/50*  (2006.01)
(52) U.S. Cl. .................. 716/5; 716/4; 716/18
(58) Field of Classification Search ............... 716/4–5, 716/18
See application file for complete search history.

(56) References Cited

U.S. PATENT DOCUMENTS 5,764,525 A * 6/1998 Mahmood et al. ............ 716/18
6,088,821 A * 7/2000 Moriguchi et al. .......... 714/724
6,154,719 A   11/2000 Saitoh et al.
2004/0128641 A1 * 7/2004 Broberg et al. ............... 716/18

FOREIGN PATENT DOCUMENTS

| JP | 5-266134 | 10/1993 |
| JP | 7-302281 | 11/1995 |
| JP | 2001-306646 | 11/2001 |

\* cited by examiner

*Primary Examiner*—Paul Dinh
*Assistant Examiner*—Tuyen To
(74) *Attorney, Agent, or Firm*—Staas & Halsey LLP

(57) ABSTRACT

A logic verification device, a logic verification method and a logic verification computer program that can reduce the number of steps involved in designing a logic circuit particularly when the designed logic circuit is subjected to logic verification and modification at the spot where an error is detected. The logic verification device comprises a data converter section adapted to convert real circuit data to be processed for designing a logic circuit into data for verification to be processed for logic verification and vice versa, a verifier section adapted to operate for logic verification of said data for verification and a temporary modifier section adapted to acquire the result of verification of said verifier section and the modification candidate data corresponding to the result of verification of said verifier section and preselected as candidate data for modification of said data for verification and modify said data for verification on the basis of said acquired result of verification and said acquired modification candidate data.

18 Claims, 8 Drawing Sheets

FIG. 3
| verification item | temporary modification mode | specification of verification area |
|---|---|---|
| check A | ◆ | |
| check B | ◇ | |
| check C | ◆ | |
FIG. 4
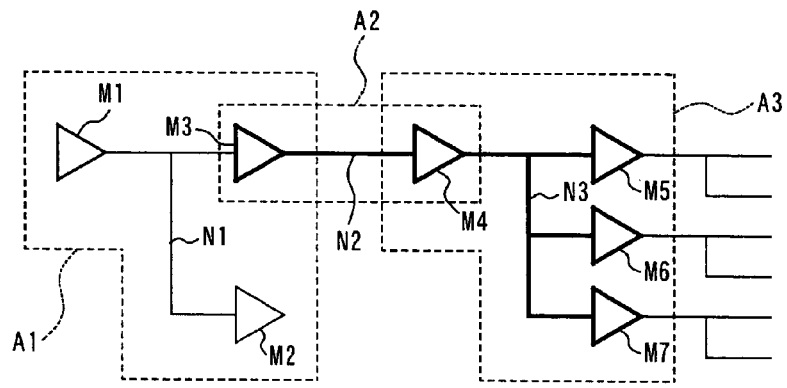
FIG. 5
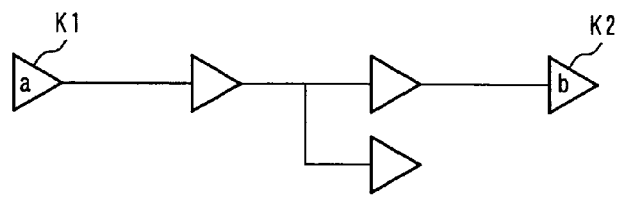
FIG. 6
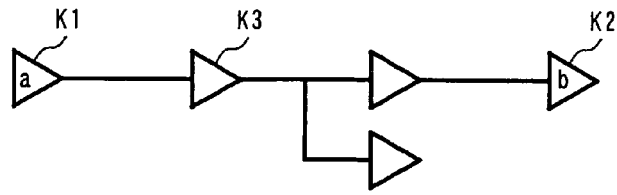

FIG. 7
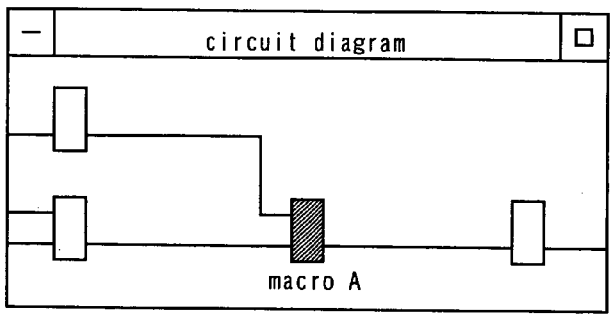
FIG. 8
FIG. 9
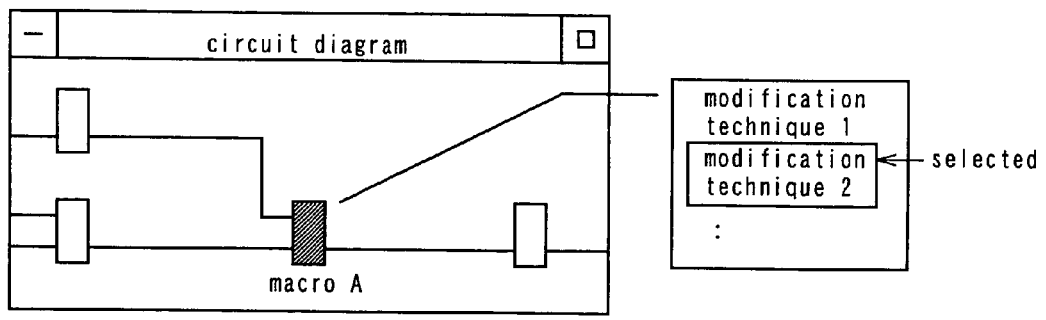

FIG. 10
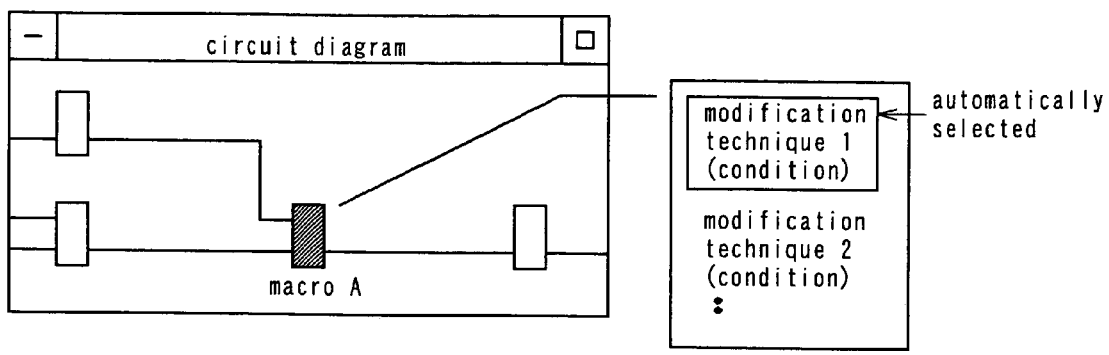
FIG. 11
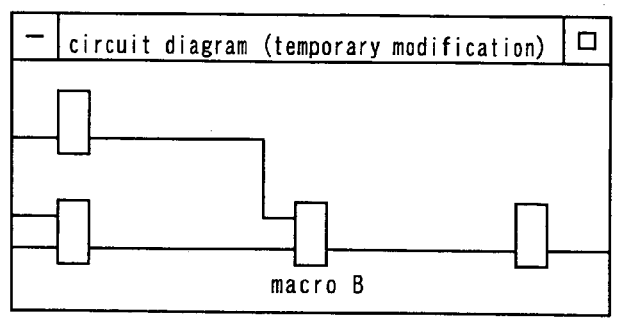
FIG. 12
| temporary modification version number control image | |
|---|---|
| modification | result of verification |
| version No. 1 | version No. 1 |
| Version No. 2 | Version No. 2 |
| Version No. 3 | Version No. 3 |

```
module test (...
input
  :

b⁓ ckdv2a  clk2_0( .a( ···
a⁓ // ckdv2vb clk2_0( .a( ···
```

LOGIC VERIFICATION DEVICE, LOGIC VERIFICATION METHOD AND LOGIC VERIFICATION COMPUTER PROGRAM

BACKGROUND OF THE INVENTION

1. Field of the Invention

This invention relates to a logic verification device, a logic verification method and a logic verification computer program.

2. Description of the Related Art

In conventional operations of designing logic circuits by means of CAD techniques, the designed logic circuit is logically verified in order to eliminate logic design errors that can intervene during the design procedures by mistake. If an error is detected as a result of logic verification, the designer looks into the cause of the error and corrects the designed logic circuit so as to remove the cause of the detected error.

Generally, the data to be processed in the operation of designing a logic circuit and correcting it (hereinafter referred to as real circuit data) and the data to be processed in the operation of logic verification (hereinafter referred to as data for verification) are different from each other in terms of data format. Therefore, the designer is forced to carry out the operation of designing a logic circuit, correcting it and logically verifying it repeatedly until no error is detected by logic verification, conducting data conversions between real circuit data and data for verification (see, inter alia, Patent Documents 1 through 3).

[Patent Document 1]
Japanese Patent Laid-Open No. 5-266134 (pp. 3–4, FIG. 1)

[Patent Document 2]
Japanese Patent Laid-Open No. 7-302281 (pp. 6–16, FIG. 1)

[Patent Document 3]
Japanese Patent Application Laid-Open Publication No. 2001-306646 (pp. 8–15, FIG. 1)

With conventional logic verification devices, when an error is detected at a spot in an area of the designed logic circuit as a result of logic verification, the process of logic verification is suspended at the time when the error is detected. In such an occasion, if another error exists at some other spot in the area where the error is detected (and hence a plurality of errors exist in the area that is subjected to logic verification), the second error is detected only when the logic is corrected at the spot where the first error is detected (e.g., circuit error 1 and circuit error 2 in the verification area between component a and component b of the circuit illustrated in FIG. 19).

In other words, when an operation of logic verification is conducted to follow the preceding operation of logic verification conducted on data for verification by converting the real circuit data obtained by the correction made to the spot where an error is detected in the real circuit data during the preceding operation of logic verification into data for verification, another error can be detected at some other spot regardless of the correction. If such is the case, the operation of converting real circuit data into data for verification and vice versa needs to be repeated for a number of times in order to detect a plurality of errors in an area selected for logic verification. This is a cause, among others, of a large number of steps that are involved in designing a logic circuit.

Additionally, since it is impossible to locate the errors other than the currently detected error that may exist, a correction technique that may not be the best one may inevitably be applied to the operation of correcting the detected error. Consequently, the previously applied correction technique may have to be altered when some other error is detected. Such an alteration to the previously applied correction technique entails an unnecessary operation of converting real circuit data into data for verification and vice versa and an increased number of steps that are involved in designing a logic circuit.

SUMMARY OF THE INVENTION

In view of the above identified problems, it is therefore an object of the present invention to provide a logic verification device, a logic verification method and a logic verification computer program that can reduce the number of steps involved in designing a logic circuit particularly when the designed logic circuit is subjected to logic verification and modification at the spot where an error is detected.

In an aspect of the present invention, the above object is achieved by providing a logic verification device comprising: a data converter section adapted to convert real circuit data to be processed for designing a logic circuit into data for verification to be processed for logic verification and vice versa; a verifier section adapted to operate for logic verification of the data for verification; a temporary modifier section adapted to acquire the result of verification of said verifier section and the modification candidate data corresponding to the result of verification of said verifier section and pre-selected as candidate data for modification of said data for verification and modify said data for verification on the basis of said acquired result of verification and said acquired modification candidate data.

With this arrangement, it is possible to reduce the number of times of data conversions by making it possible to modify the data for verification to be processed for logic verification. Additionally, since the data for verification that have been modified can also be subjected to logic verification, it is possible to repeat an operation of logic verification and an operation of modification on the data for verification without subjecting them to conversion so that consequently, it is also possible to detect an error at a spot other than the spot where the currently detected error is located. Furthermore, since the operation of modification is conducted on the basis of the acquired modification candidate data, it is possible to reduce the extra work by the designer at the time of modification of the logic circuit and suppress occurrences of design errors. In short, it is possible to reduce the number of steps involved in designing a logic circuit particularly when the designed logic circuit is subjected to logic verification and modification at the spot where an error is detected.

Further, it is possible to conduct an operation of logic verification on the data for verification that have been modified and, if no logic verification error is detected, convert the data for verification that have been modified into real circuit data.

Preferably, a logic verification device according to the invention and having a configuration as described above further comprises a modification candidate data storage section adapted to store said modification candidate data corresponding to the result of verification of said verifier section and a modification candidate data selector section adapted to arbitrarily select modification candidate data out of the modification candidate data stored in said modification candidate data storage section corresponding to the result of verification acquired by said temporary modifier section according to the user inputs, said temporary modifier section being adapted to modify said data for verification on the basis of said modification candidate data arbitrarily selected by said modification candidate data selector section.

With this arrangement, the modification to be made with regard to the logic verification error in the data for verification can be selectively defined on the basis of the modification candidate data that are arbitrarily selected from the pre-selected as candidate data so as to reduce the extra work of modification. Additionally, it is possible to suppress occurrences of errors during the operation of modification.

Preferably, a logic verification device according to the invention and having a configuration as described above further comprises a modification candidate data storage section adapted to store said modification candidate data corresponding to the result of verification of said verifier section and predetermined conditions for selection, said temporary modifier section being adapted to select modification candidate data out of the modification candidate data stored in said modification candidate data storage section on the basis of said acquired result of verification and said predetermined conditions for selection and modify said data for verification on the basis of said selected modification candidate data.

With this arrangement, it is possible to automatically conduct an operation of modification on the data for verification in order to improve the efficiency of logic design work.

Preferably, a logic verification device according to the invention and having a configuration as described above further comprises a temporary modification-related information storage section adapted to store the modifications made to the data for verification by said temporary modifier section corresponding respectively to the modification version numbers and a temporary modification version number selector section adapted to select the modification of an arbitrarily selected number of version to reflect the selected modification to said real circuit data.

With this arrangement, it is possible for the user to select the optimum modification data according to the user's judgment out of the modifications made to the data for verification in the past that carry respective modification version numbers.

A logic verification device according to the invention and having a configuration as described above may further comprise a verification rule-related information storage section adapted to store verification rule-related information to be used for defining the logic verification to be made by said verifier section, said verifier section being adapted to exclude a specific part of said data for verification from the object of verification according to said verification rule-related information.

Preferably, a logic verification device according to the invention and having a configuration as described above further comprises a verification rule-related information storage section adapted to store verification rule-related information to be used for defining the logic verification to be made by said verifier section, said verifier section being adapted to select only the part of data for verification liable to be influenced by the modification according to said verification rule-related information when the logic verification is conducted on the data for verification modified by the temporary modifier section.

With this arrangement, it is no longer necessary to repeat an operation of verification on the part of the data for verification that does not need logic verification (e.g., a part that has been subjected to logic verification and hence contains no error) so that it is possible to improve the processing efficiency of logic verification.

In another aspect of the invention, there is provided a logic verification method comprising: a data conversion step of converting real circuit data to be processed for designing a logic circuit into data for verification to be processed for logic verification and vice versa; a verification step of operating for logic verification of said data for verification; a temporary modification step of acquiring the result of verification of said verification step and the modification candidate data corresponding to the result of verification of said verification step and pre-selected as candidate data for modification of said data for verification and modifying said data for verification on the basis of said acquired result of verification and said acquired modification candidate data.

Preferably, a logic verification method according to the invention and comprising the above described steps further comprises a modification candidate data storage step of storing said modification candidate data corresponding to the result of verification of said verification step and a modification candidate data selection step of arbitrarily selecting modification candidate data out of the modification candidate data stored in said modification candidate data storage step corresponding to the result of verification acquired in said temporary modification step according to the user inputs, said temporary modification step being adapted to modify said data for verification on the basis of said modification candidate data arbitrarily selected in said modification candidate data selection step.

Preferably, a logic verification method according to the invention and comprising the above described steps further comprises a modification candidate data storage step of storing said modification candidate data corresponding to the result of verification of said verification step and predetermined conditions for selection, said temporary modification step being adapted to select modification candidate data out of the modification candidate data stored in said modification candidate data storage step on the basis of said acquired result of verification and said predetermined conditions for selection and modify said data for verification on the basis of said selected modification candidate data.

A logic verification method according to the invention and comprising the above-described steps may further comprise a temporary modification-related information storage step of storing the modifications made to the data for verification in said temporary modification step corresponding respectively to the modification version numbers and a temporary modification version number selection step of selecting the modification of an arbitrarily selected number of version out of the modifications stored in the temporary modification-related information storage step according to the user inputs to reflect the selected modification to said real circuit data.

Preferably, a logic verification method according to the invention and comprising the above described steps further comprises a verification rule-related information storage step of storing verification rule-related information to be used for defining the logic verification to be made in said verification step, said verification step being adapted to exclude a specific part of said data for verification from the object of verification according to said verification rule-related information.

A logic verification method according to the invention and comprising the above described steps may further comprise a verification rule-related information storage step of storing verification rule-related information to be used for defining the logic verification to be made in said verification step, said verification step being adapted to select only the part of data for verification liable to be influenced by the modification according to said verification rule-related information when the logic verification is conducted on the data for verification modified in the temporary modification step.

In still another aspect of the invention, there is provided a logic verification computer program adapted to drive a computer to execute: a data conversion step of converting real circuit data to be processed for designing a logic circuit into data for verification to be processed for logic verification and vice versa; a verification step of operating for logic verification of said data for verification; and a temporary modification step of acquiring the result of verification of said verification step and the modification candidate data corresponding to the result of verification of said verification step and pre-selected as candidate data for modification of said data for verification and modifying said data for verification on the basis of said acquired result of verification and said acquired modification candidate data.

Preferably, a logic verification computer program according to the invention and comprising the above described steps further comprises a modification candidate data storage step of storing said modification candidate data corresponding to the result of verification of said verification step and a modification candidate data selection step of arbitrarily selecting modification candidate data out of the modification candidate data stored in said modification candidate data storage step corresponding to the result of verification acquired in said temporary modification step according to the user inputs, said temporary modification step being adapted to modify said data for verification on the basis of said modification candidate data arbitrarily selected in said modification candidate data selection step.

Preferably, a logic verification computer program according to the invention and comprising the above described steps further comprises a modification candidate data storage step of storing said modification candidate data corresponding to the result of verification of said verification step and predetermined conditions for selection, said temporary modification step being adapted to select modification candidate data out of the modification candidate data stored in said modification candidate data storage step on the basis of said acquired result of verification and said predetermined conditions for selection and modify said data for verification on the basis of said selected modification candidate data.

A logic verification computer program according to the invention and comprising the above described steps may further comprise a temporary modification-related information storage step of storing the modifications made to the data for verification in said temporary modification step corresponding respectively to the modification version numbers and a temporary modification version number selection step of selecting the modification of an arbitrarily selected number of version out of the modifications stored in the temporary modification-related information storage step according to the user inputs to reflect the selected modification to said real circuit data.

Preferably, a logic verification computer program according to the invention and comprising the above described steps further comprises a verification rule-related information storage step of storing verification rule-related information to be used for defining the logic verification to be made in said verification step, said verification step being adapted to exclude a specific part of said data for verification from the object of verification according to said verification rule-related information.

A logic verification computer program according to the invention and comprising the above described steps may further comprise a verification rule-related information storage step of storing verification rule-related information to be used for defining the logic verification to be made in said verification step, said verification step being adapted to select only the part of data for verification liable to be influenced by the modification according to said verification rule-related information when the logic verification is conducted on the data for verification modified in the temporary modification step.

A logic verification computer program according to the invention as described above can drive the computer of a logic verification device to execute it by having the computer to store it in a readable recording medium. Computer-readable recording mediums that can be used for the purpose of the invention include portable recording mediums such as CD-ROMs, flexible disks, DVD disks, magneto-optical disks and IC cards as well as data bases adapted to store computer programs, computers, data bases of other types and transmission mediums on communication lines.

The steps of a logic verification method according to the invention as described above can be carried out by driving a computer to execute a logic verification computer program according to the invention.

BRIEF DESCRIPTION OF THE DRAWINGS

FIG. 3 is a schematic illustration of an image that can be displayed by the verification specifier section when specifying the items of verification;

FIG. 4 is a schematic illustration of an operation of specifying an area of logic verification;

FIG. 5 is a schematic illustration of another operation of specifying an area of logic verification;

FIG. 6 is a schematic illustration of still another operation of specifying an area of logic verification;

FIG. 7 is a schematic illustration of error information obtained as a result of logic verification that can be displayed on a display section (not shown);

FIG. 8 is a schematic illustration of a circuit diagram that can be displayed on a display section (not shown) for a part that corresponds to the selected error;

FIG. 9 is a schematic illustration of an image of a list of candidate modification techniques that are defined so as to establish correspondence to possible causes of errors;

FIG. 10 is a schematic illustration of an operation of automatically modifying data for verification:

FIG. 11 is a schematic illustration of another operation of automatically modifying data for verification;

FIG. 12 is a schematic illustration of a temporary modification version number control image which is displayed on the temporary modification version number selector section;

DETAILED DESCRIPTION OF THE PREFERRED EMBODIMENTS

The present invention will be described in detail by referring to the accompanied drawings that schematically illustrate preferred embodiments of the invention.

Figure 1:
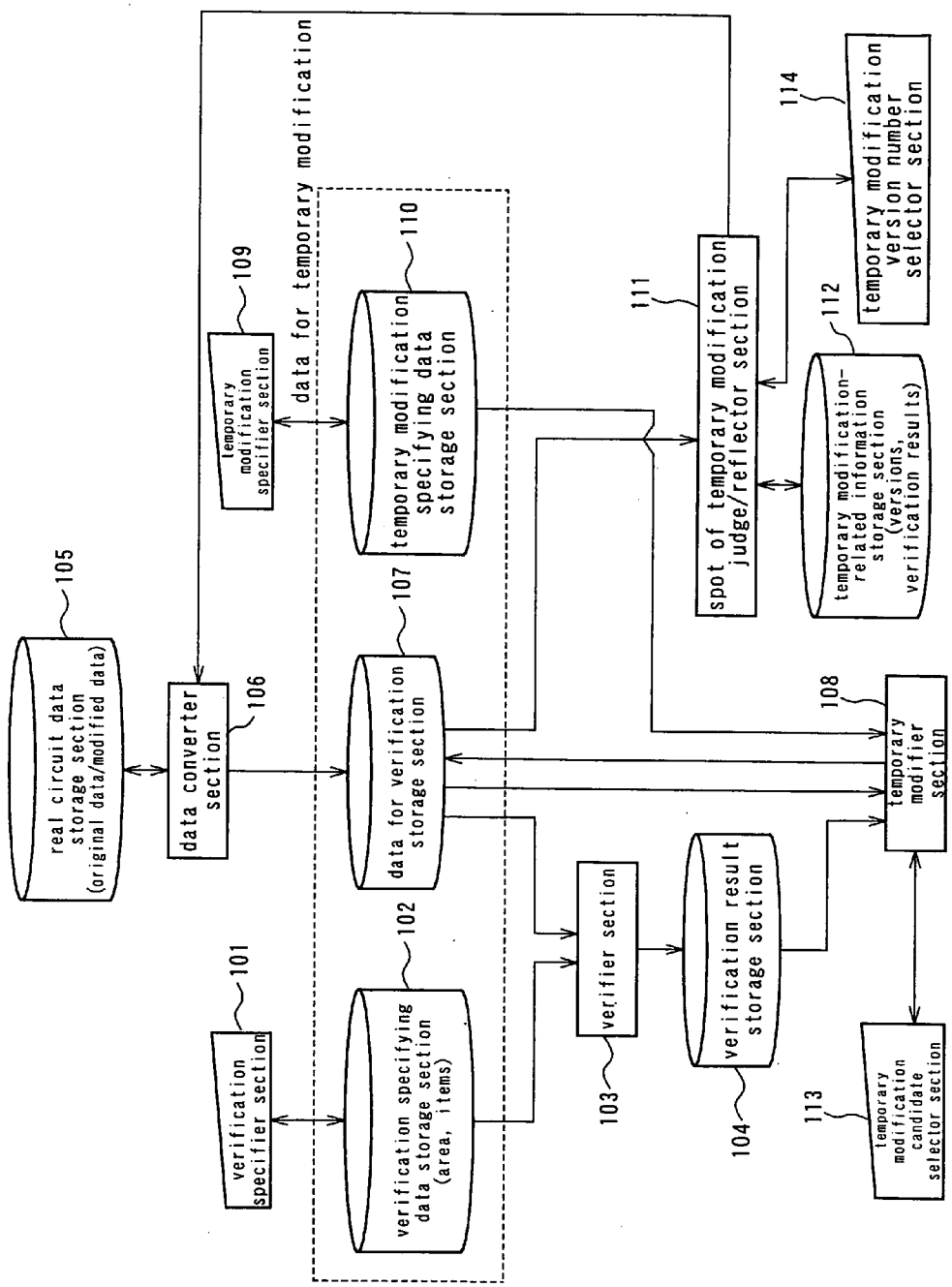
FIG. 1 is a schematic functional block diagram of an embodiment of logic verification device according to the invention, showing the entire configuration thereof.

FIG. 1 is a schematic functional block diagram of an embodiment of logic verification device according to the invention, showing the entire configuration thereof.

This embodiment of logic verification device comprises a verification specifier section 101, a verification specifying data storage section 102, a verifier section 103, a verification result storage section 104, a real circuit data storage section 105, a data converter section 106, a data for verification storage section 107, a temporary modifier section 108, a temporary modification specifier section 109, a temporary modification specifying data storage section 110, a spot of temporary modification judge/reflector section 111, a temporary modification-related information storage section 112, a temporary modification candidate selector section 113, a temporary modification version number selector section 114, an operation input section (not shown), a display section (not shown), a CPU (not shown) and a storage section (not shown).

The components of this embodiment of logic verification device will be described in detail below.

The verification specifier section 101 takes the role of receiving user inputs and specifying the items and the area of logic verification for the designed circuit.

The verification specifying data storage section (verification rule-related information storage section) 102 is typically formed by a storage area of an HDD, a RAM or the like and takes the role of storing the information selected for the items and the area of verification as specified by verification specifier section 101. In other words, it takes the role of storing the verification rule-related information that defines the logic verification to be conducted by the verifier section (verification rule-related information storage step).

The verifier section 103 conducts an operation of logic verification on the data for verification (to be processed for logic verification) stored in the data for verification storage section 107 according to the specifications for verification provided by the verification specifier section 101 and stored in the verification specifying data storage section 102.

The verification result storage section 104 is typically formed by a storage area of an HDD, a RAM or the like and takes the role of storing the result of the logic verification conducted by the verifier section 103.

The real circuit data storage section 105 is typically formed by a storage area of an HDD, a RAM, an MO or the like and takes the role of separately storing the original real circuit data (to be processed when designing a logic circuit) for the circuit that is currently being designed and the real circuit data obtained by modifying the original real circuit data. The real circuit data obtained as a result of modification may be treated as the original real circuit data for the next modification. While the real circuit data storage section 105 separately stores the original real circuit data and the real circuit data obtained by modifying the original real circuit data in the above description, the present invention is by no means limited thereto and it may alternatively so arranged that the original real circuit data are overwritten by the real circuit data obtained by modifying the original real circuit data and the latter real circuit data are treated as original real circuit data for the next modification.

The data converter section 106 takes the role of converting real circuit data into data for verification and inversely converting data for verification into real circuit data.

The data for verification storage section 107 takes the role of storing the data for verification obtained by converting real circuit data and the data for verification that have been temporarily modified (modification conducted on data for verification) by the temporary modifier section 108.

The temporary modifier section 108 is adapted to acquire the temporary modification candidate data stored in the temporary modification specifying data storage section 110, which will be described in detail hereinafter, and the result of verification of the verifier section 103 and temporarily modify the data for verification stored in the data for verification storage section 107 according to the specifications provided by the temporary modification candidate selector section 113, which will be described in detail hereinafter.

The temporary modification specifier section 109 takes the role of providing specifications for the temporary modification to be conducted on the data for verification by the temporary modifier section 108. More specifically, it provides specifications on the temporary modification candidates (temporary modification candidate data) that tell how respective modifications are conducted. The temporary modification candidates that are specified here are defined according to the design rules on logic circuits. For the purpose of the invention, a single candidate or a plurality of candidates may be specified.

The temporary modification specifying data storage section (modification candidate data storage section) 110 takes the role of storing the temporary modification candidate data specified by the temporary modification specifier section 109 (the data relating to the specified temporary modification methods and defined as candidates for modification of the data for verification corresponding to the result of verification) and other data (modification candidate data storage step).

The spot of temporary modification judge/reflector section 111 takes the role of judging the spot of temporary modification of the data for verification that have been temporarily modified and stored in the data for verification storage section 107 and transmitting information on the temporary modification conducted on the data for verification to the temporary modification-related information storage section 112, while reflecting the temporary modification of the version number selected from the temporary modifications conducted on the data for verification stored in the temporary modification-related information storage section 112 to the real circuit data (real modification) according to the specifications for selection provided by the temporary modification version number selector section 114.

The temporary modification-related information storage section 112 takes the role of storing the temporary modifications conducted on the data for verification so as to establish correspondence to the result of logic verification for the data for verification that are temporarily modified for each version number (so as to correspond to the respective version numbers).

The temporary modification candidate selector section 113 takes the role of arbitrarily selecting one of the temporary modification methods listed for the temporary modification candidate data stored in the temporary modification specifying data storage section 110 according to the user inputs. The temporary modification candidate selector section 113 makes its own selection only when the temporary modifier section "semi-automatically" performs a temporary modification (as will be described in detail hereinafter).

The temporary modification version number selector section 114 takes the role of selecting the data for verification of an arbitrarily selected version number out of the data for verification that have been modified and stored in the temporary modification-related information storage section 112.

Each of the verification specifier section 101, the temporary modification specifier section 109, the temporary modification candidate selector section 113 and the temporary modification version number selector section 114 is formed by a keyboard, a mouse a display and the like and adapted to receive user inputs and display the user input and the target of the user input to the user. Alternatively, each of the verification specifier section 101, the temporary modification specifier section 109, the temporary modification candidate selector section 113 and the temporary modification version number selector section 114 may be formed by a touch panel display.

More specifically, the verification specifier section 101 can display the information specified by the user that relates to the items and the area of logic verification stored in the verification specifying data storage section 102 and images to be used for inputting and specifying such information.

The temporary modification specifier section 109 can display the temporary modification candidate data already specified by the user and stored in the temporary modification specifying data storage section 110 and images to be used for inputting and specifying temporary modification candidate data.

The temporary modification candidate selector section 113 can display the temporary modification candidate data acquired by the temporary modifier section 108 from the temporary modification specifying data storage section 110 so that the user may arbitrarily select any of them.

The temporary modification version number selector section 114 can display the plurality of temporary modifications conducted on the data for verification stored in the temporary modification-related information storage section 112 and the result of verification of each of the temporary modifications to the user so that the user may select the temporary modification of any arbitrarily selected version number by referring to the results of the verifications.

While the verification specifier section 101, the temporary modification specifier section 109, the temporary modification candidate selector section 113 and the temporary modification version number selector section 114 are provided separately in the above description, the functions of these sections can alternatively be realized by means of an operation input section (not shown) (including a keyboard, a mouse and a display or a touch display panel). The user can temporarily modify the data for verification by operating the operation input section (not shown) to input necessary commands and/or information.

The display section (not shown) is typically formed by a CRT display, a liquid crystal display or the like and the memory section (not shown) is typically formed by the storage area of an HDD or a RAM.

The flow of the processing operation of this embodiment of logic verification device according to the invention will be described below.

Figure 2:
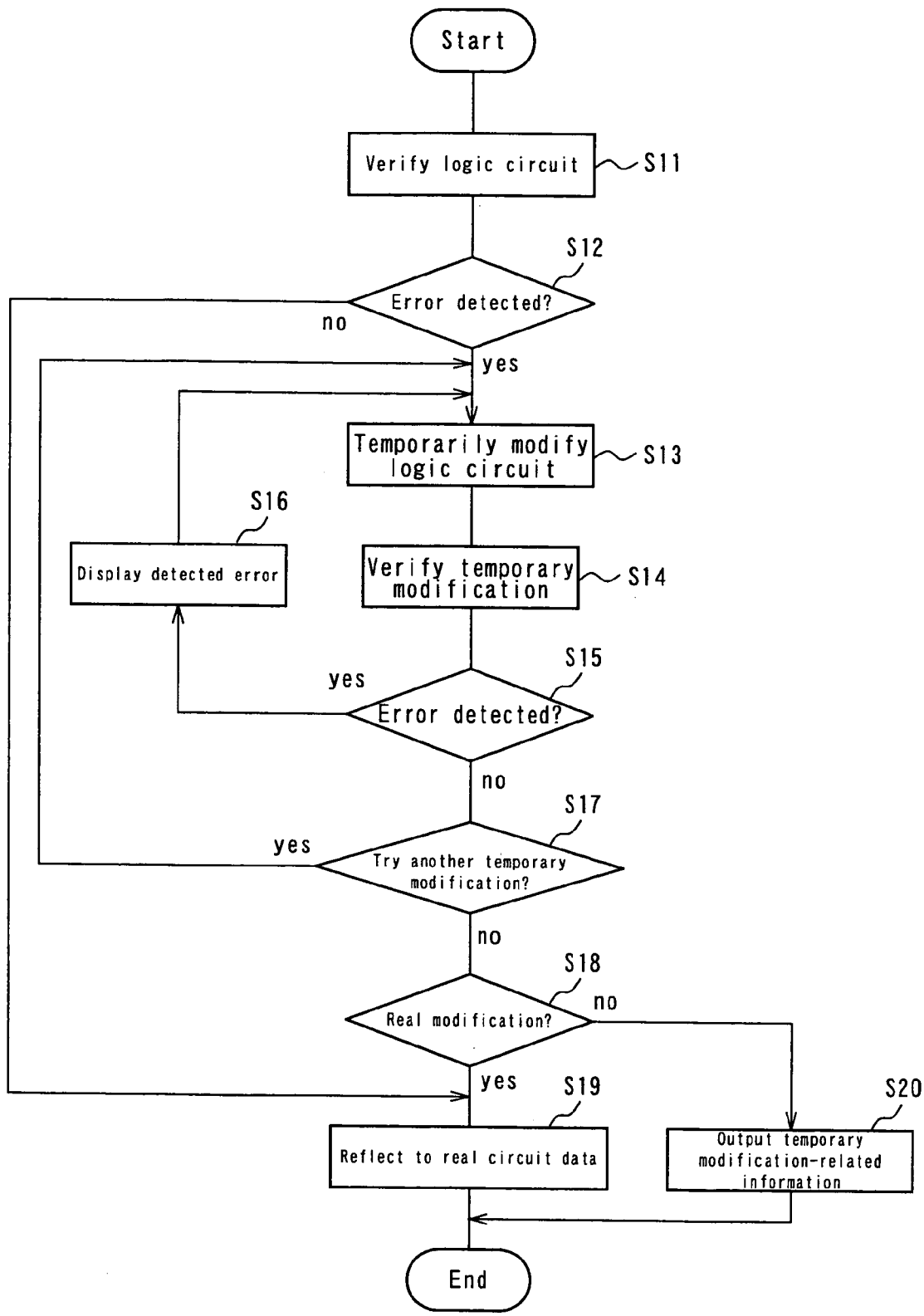
FIG. 2 is a flow chart of the processing operation of the embodiment of logic verification device of FIG. 1.

FIG. 2 is a flow chart of the processing operation of the embodiment of logic verification device.

For conducting an operation of logic verification on the real circuit data that are used for designing a logic circuit and stored in the real circuit data storage section 105, firstly the real circuit data to be subjected to logic verification are converted into data for verification by means of the data converter 106 (data conversion step). Then, the verifier section 103 conducts an operation of logic verification on the data for verification that are stored in the data for verification storage section 107 (verification step) (S11). As described above, the necessary details of the logic verification (the items and the area of verification) are predefined by the verification specifier section 101.

When an error is detected for an item of logic verification, the user can select a temporary modification mode (manual) where the operation of logic verification is suspended at the time of detection of the error and the user manually conducts an operation of temporary modification on the data for verification in which the error is detected, a temporary modification mode (semi-automatic) where the operation of logic verification is suspended at the time of detection of the error and the user selects one of the several predefined modification candidates and conducts an operation of temporary modification on the data for verification by using the selected modification candidate and a temporary modification mode (automatic) where the data for verification, in which an error is detected, are automatically subjected to temporary modification, using the predefined modification candidate, at the time when the error is detected.

It may be needless to say that part of the circuit to be verified may be selected as area of logic verification and the operation of logic verification may skip over a certain area. FIG. 3 is a schematic illustration of an image that can be displayed by the verification specifier section 101 when specifying the items of verification. The temporary modification specifier section 109 may alternatively be used to select one of the above listed temporary modification modes.

How the area of logic verification is specified will be described by referring to FIGS. 4 through 6. After temporary modification, only an area of the circuit that the temporary modification of the data for verification can influence is selected. Therefore, the part of the data for verification that does not influence the circuit will not be subjected to logic verification. In other words, the verifier section excludes a specific part of the data for verification from the object of verification by referring to the verification rule-related information. More specifically, when the data for verification that have been modified by the temporary modifier section are subjected to logic verification, only the part of the data for verification that will influence the circuit as a result of the modification is selected as object of verification by referring to the verification rule-related information.

For instance, when an operation of logic verification is conducted on a connection line by connection line (net by net) basis, each connection line connecting components (macros) of the circuit, it is conducted only when the macros that operates as drivers for respective nets and those that operate as receivers for respective nets are altered. The circuit illustrated in FIG. 4 comprises macros M1 through M7 and nets N1 through N3 that connect the macros. If, for example, the macro M4 is altered as a result of temporary modification, neither the driver nor the receiver are altered for the net N1 and only the receiver is altered for the net N2, while only the driver is altered for the net N3. Therefore, the object of logic verification includes the area A2 and the area A3 of the circuit.

When an operation of logic verification is conducted on the path connecting selected macros of the circuit, it is conducted only when the condition of connecting the selected macros is altered. FIG. 5 illustrates a path connecting selected macros K1 and K2 that is not altered by temporary modification. In this condition, the path connecting the macros K1 and K2 is excluded from the object of logic verification.

FIG. 6 illustrates a condition where the path connecting selected macros K1 and K2 is altered (e.g., macro K3 is altered) by temporary modification. In this condition, the path connecting the macros K1 and K2 is included in the object of logic verification.

FIG. 7 illustrates an image which is displayed on the display section (not shown) to show the error information that is obtained as a result of the operation of logic verification conducted on the data for verification in a manner as described above. In this embodiment, the errors detected as a result of logic verification (check items, error messages and the like) are displayed on the display section (not shown). When one of the displayed errors is selected by operating the operation input section (not shown), a circuit diagram of the area of the circuit for which the data for verification have been subjected to logic verification and in which the error is detected (macro (component of logic circuit) A in this example) is displayed on the display section (not shown) as shown in FIG. 8. Thus, the designer may be able to intuitionally grasp what is wrong about the circuit because a list of the errors is displayed and the user can see a circuit diagram of each error area. In other words, the above described arrangement of this embodiment can dissolve the problem that the operation of identifying the cause of an error is time consuming because conventionally, when an error is detected as a result of logic verification, the designer is forced to analyze the error and modify the circuit by tracing the circuit forwardly/backwardly from the spot of the error by means of analysis tools.

When an error is detected (S12, Yes) as a result of logic verification (S11), the processing operation proceeds to temporary modification (S13) of the data for verification in which the error is detected.

The temporary modifier section 108 conducts an operation of temporary modification (temporary modification step) on the data for verification, using the temporary modification candidate data defined by the temporary modification specifier section 109 and stored in the temporary modification specifying data storage section 110 (S13). As for the technique of temporary modification, the selected temporary modification mode will be used when an error is detected in the above described logic verification step (S11).

The three temporary modification modes that can be used in this embodiment of logic verification device will be described in detail below.

(1) Manual Modification

In this mode of operation, the user manually and temporary modify the circuit for the data for verification by means of the operation input section (not shown), by referring to the error information of the error list (see FIG. 7) and the circuit diagram of the area of the circuit where the error is detected (see FIG. 8).

(2) Semi-automatic Modification

In this mode of operation, a list of candidate modification techniques that are defined in advance so as to establish correspondence to possible causes of errors are displayed along with a circuit diagram of the area of the circuit where the error occurred (see FIG. 8) on the display section (not shown) in a manner as illustrated in FIG. 9. Then, the user conducts an operation of temporary modification, selecting one of the candidate modification techniques out of the list by way of the temporary modification candidate selector section 113 (modification candidate data selection step). In other words, this embodiment has a temporary modification candidate selector section that is used to select appropriate temporary modification candidate data out of the temporary modification candidate data stored in the temporary modification specifying data storage section so as to establish correspondence to the result of verification acquired by the temporary modifier section in response to the user input operation. Then, the temporary modifier section modifies the data for verification by referring to the appropriate temporary modification candidate data selected by way of the temporary modification candidate selector section.

(3) Automatic Modification

In this mode of operation, the data for verification are automatically subjected to an operation of temporary modification by means of the modification technique defined in advance so as to establish correspondence to the cause of the error. If a number of techniques are provided for the cause of the error, the requirements to be met for selecting one of the candidate modification techniques are defined in advance (see FIG. 10). The data on the selection requirements are stored in the temporary modification specifying data storage section 110 so as to establish correspondence to the result of verification obtained by the verifier section and the data on the temporary modification candidates are provided corresponding to the selection requirements (predetermined selection requirements). In the instance of FIG. 10, the "modification technique 1" is automatically selected on the basis of the selection requirements. The circuit will be automatically subjected to temporary modification (e.g., shift from macro A to macro B) on the basis of the cause of the detected error and the selection requirements (see FIG. 11). In other words, the temporary modifier section appropriately selects some of the temporary modification candidate data stored in the temporary modification specifying data storage section and conducts an operation of temporary modification on the data for verification by referring to the selected temporary modification candidate data.

With the "semi-automatic modification" mode and the "automatic modification" mode, it is possible to suppress modification errors attributable to manual modification.

The data for verification that are subjected to an operation of temporary modification are then stored in the data for verification storage section 107.

Subsequently, in S14, the verifier section 103 conducts an operation of logic verification on the data for verification that are subjected to temporary modification in the above described step (S13).

If a logic verification error is detected by the operation of logic verification conducted on the temporarily modified data for verification (S15, Yes), the detected error is displayed on the display section (not shown) (S16) and the processing operation proceeds again to the temporary modification step (S13).

If, on the other hand, no logic verification error is detected (S15, No) or when some other temporary modification candidate is tested, the processing operation also proceeds again to the temporary modification step (S13).

When the data for verification that are temporarily modified are to be reflected to the corresponding real circuit data (S18, Yes), the spot of temporary modification judge/reflector section 111 actually reflects the temporary modification to be reflected to the real circuit data by way of the data converter section 106 and stores them in the real circuit data storage section 105 (S19).

If the data for verification that are temporarily modified are not to be reflected to the corresponding real circuit data (S18, No), the spot of temporary modification judge/reflector section 111 stores the temporary modification in the temporary modification-related information storage section 112 along with the result of verification (S20). In this way, the temporary modifications that are conducted on the data for verification are classified in terms of version numbers of temporary modification and stored in the temporary modification-related information storage section 112 (temporary modification-related information storage step).

If no error is detected as a result of logic verification (S11) (S12, No), the data for verification are converted into real circuit data without being modified by the data converter section 106 (S19).

As described above, the temporary modifications conducted on the data for modification and the results of verifications are made to correspond to each other in a controlled manner so that it is possible to select the data for verification of any version number of temporary modification (temporary modification version number selection step) in a temporary modification version number control image (see FIG. 12) which is displayed on the temporary modification version number selector section 114 and make a related circuit diagram to be displayed ("version number 2" is selected in FIG. 12) in order to reflect them to the corresponding real circuit data.

Figures 13, 14:
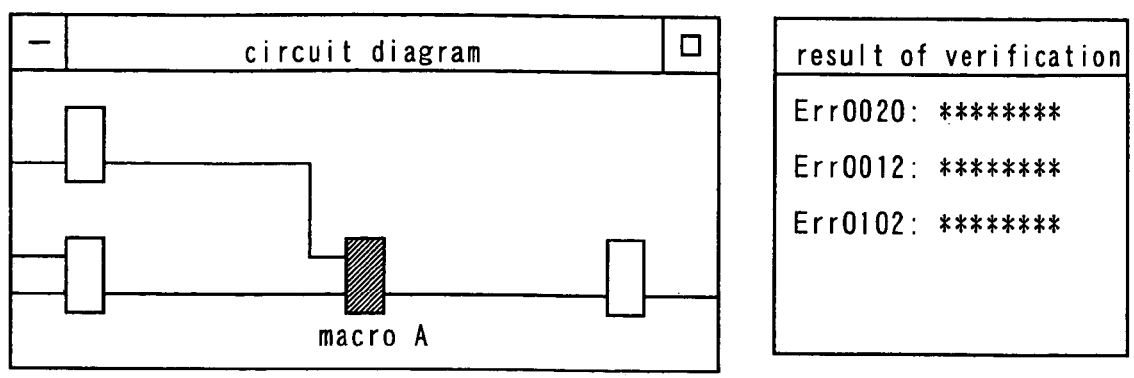
FIG. 13 is a schematic illustration of the data for verification that are subjected to the temporary modification with a version number arbitrarily selected and a corresponding circuit diagram that are displayed along with the result of the operation of verification conducted on the temporarily modified data for verification of the version number.
FIG. 14 is a schematic illustration of data for verification with a comment on the temporary modification added into the data for verification.

FIG. 13 is a schematic illustration of the data for verification that are subjected to temporary modification with a version number selected by the temporary modification version number selector section 114 and a corresponding circuit diagram that are displayed at the temporary modification version number selector section 114 or on the display section (not shown) along with the result of the operation of verification conducted on the temporarily modified data for verification of the version number.

It is also possible to select the temporary modification of a version number and output the selected data for verification with a comment on the temporary modification added into the data for verification as shown in FIG. 14. In FIG. 14, the lines of the data for verification that are not subjected to temporary modification yet are indicated by b, while the lines of the data for verification that are already subjected to temporary modification are indicated by a. It will be appreciated that the spot of temporary modification judge/reflector section 111 takes the role of adding a comment on the temporary modification into the data for verification and outputting the data.

While it is preferable that the real circuit data corresponding to the data for verification of the logic circuit to which the temporary modification of the selected version number is reflected are stored separately from the real circuit data corresponding to the data for verification to which the temporary modification is not reflected in the real circuit data storage section 105, the present invention is by no means limited thereto and the former real circuit data may alternatively be used to overwrite the latter real circuit data and stored in the real circuit data storage section 105.

In this way, when an error is detected as a result of logic verification in the real circuit data of a logic circuit, it is no longer necessary to conduct an operation of modifying the real circuit data and the operation of verifying the logic circuit can be continued only by modifying the corresponding data for verification and conducting an operation of logic verification on them. As a result, it is now possible to detect all the errors, that are hidden by a serious major error. Additionally, since it is no longer necessary to repeatedly conduct an operation of modification and logic verification on the real circuit data, it is possible to curtail the time period that is required for converting real circuit data into data for verification and vice versa and reduce the number of logic design steps.

Figure 15:
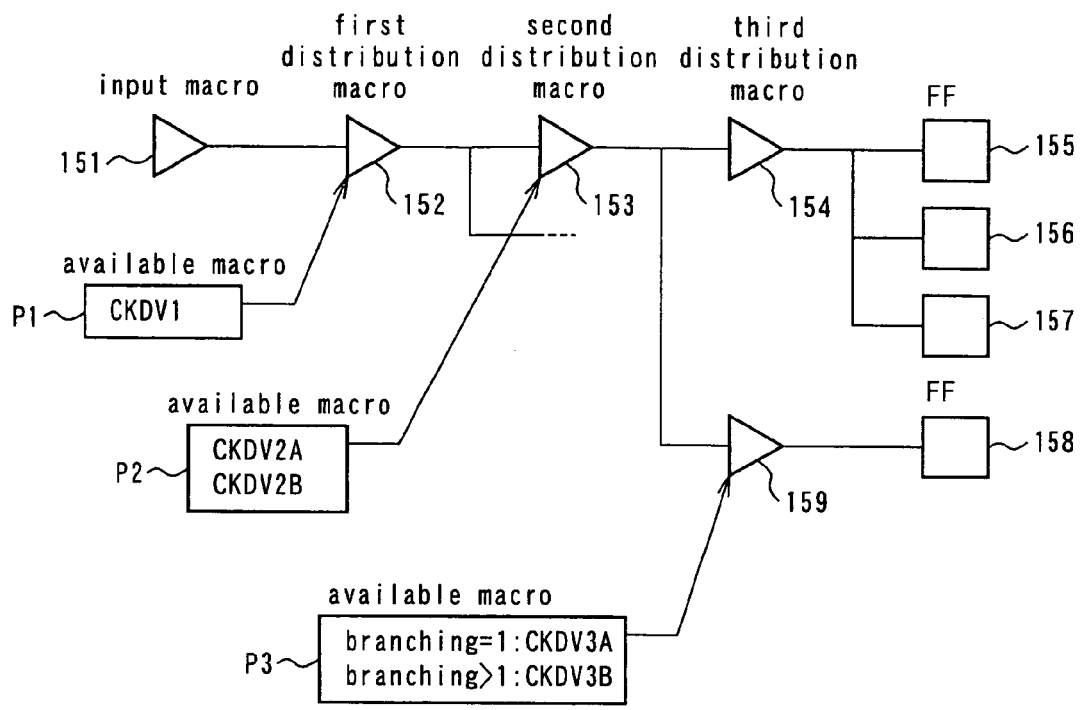
FIG. 15 is a schematic illustration of logic verification of a circuit configuration on a specified path in a designed logic circuit.

Next, a specific example of logic verification using the above described embodiment of logic verification device will be described below. FIG. 15 is a schematic illustration of verification of a circuit configuration on a specified path in a designed logic circuit (check referring to the connection rules of a clock distribution circuit).

The circuit illustrated in FIG. 15 comprises an input macro 151, a first distribution macro 152, a second distribution macro 153, a third distribution macro 154, FFs 155, 156, 157 and 158 and a macro 159. In FIG. 15, candidate macros for the first distribution macro 152, the second distribution macro 153 and the macro 159 are defined. More specifically, candidate macros P1 through P3 that can be used as replacement when a logic verification error arises are also shown.

When an operation of logic verification is conducted, using the input macro 151 as starting point and an error arises in the first distribution macro 152, the candidate macro, or the temporary modification candidate, which is defined for the first distribution macro 152 is used as replacement. Since only a single macro of temporary modification candidate P1 is defined, the candidate macro "CKDV1" automatically replaces the first distribution macro 152 (automatic modification).

When the logic verification error in the first distribution macro 152 is dissolved by the above described replacement, the operation of logic verification proceeds to the second distribution macro 153. Since two macros of temporary modification candidates ("CKDV2A" and "CKDV2B") P2 are defined for the second distribution macro 153, the temporary modification candidate selector section 113 displays those temporary modification candidates P2 and prompts the user to select either of the two temporary modification candidates P2 when an error is detected in the second distribution macro 153 (semi-automatic modification).

When the logic verification error in the second distribution macro 153 is dissolved by the above described replacement, the operation of logic verification goes on along the paths that lead to the third distribution macro 154 and to the macro 159 respectively. Two macros of temporary modification candidates ("CKDV3A" and "CKDV3B") P2 are defined for the macro 159 with a branching condition and either of the two temporary modification candidates is automatically selected for temporary modification according to the branching condition if an error is detected in the macro 159 (automatic modification).

Figure 16:
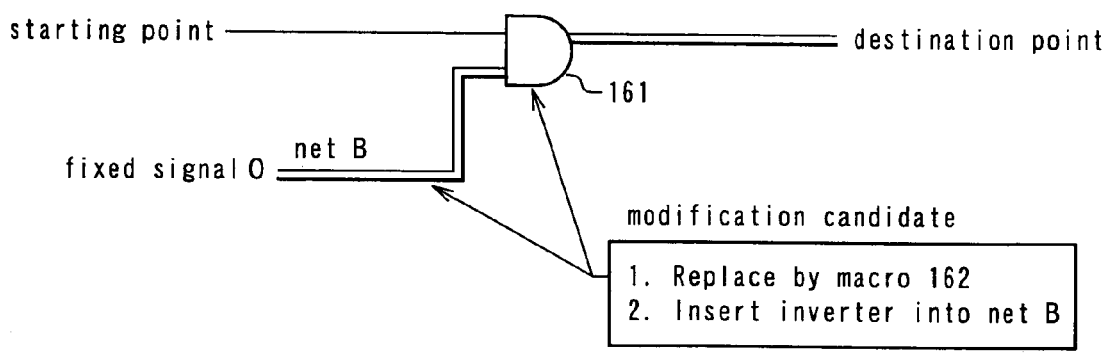
FIG. 16 is a schematic illustration of an operation of logic verification of a path from an arbitrarily defined starting point to an arbitrarily defined destination point.
Figure 17:
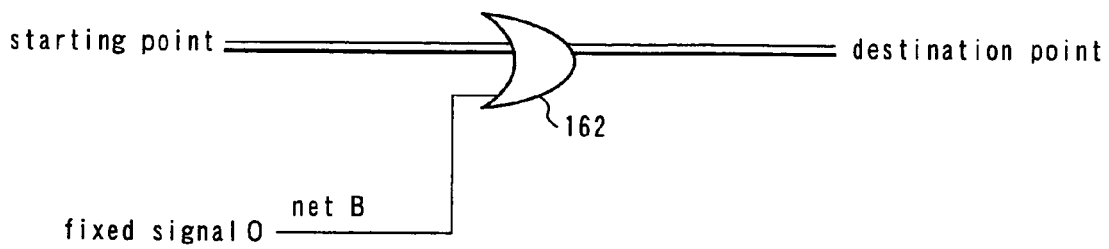
FIG. 17 is a schematic illustration of another operation of logic verification of a path from an arbitrarily defined starting point to an arbitrarily defined destination point.
Figure 18:
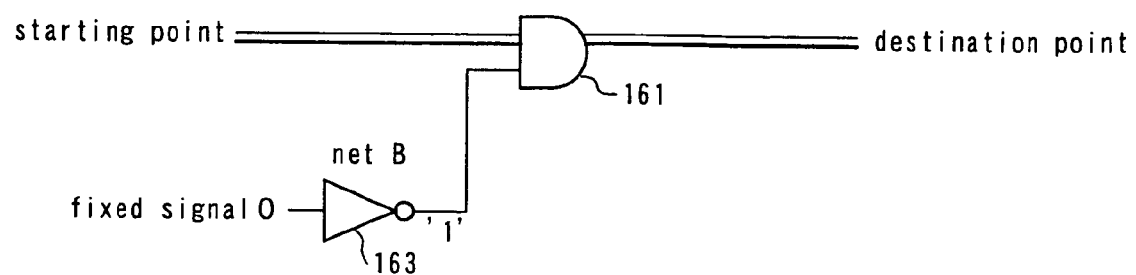
FIG. 18 is a schematic illustration of still another operation of logic verification of a path from an arbitrarily defined starting point to an arbitrarily defined destination point.
Figure 19:
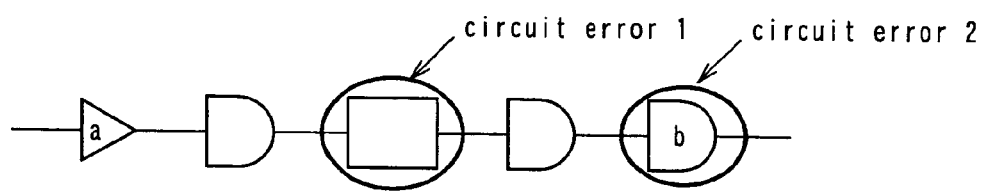
FIG. 19 is a schematic illustration for explaining the conventional logic verification device.

FIGS. 16 through 18 are schematic illustrations of logic verification of a path from an arbitrarily defined starting point to an arbitrarily defined destination point. In FIG. 16, a macro 161 (AND) is arranged on the path from the starting point to the destination point. If an error is detected in the macro 161 as a result of logic verification for the area between the starting point and the destination point, temporary modification candidates that are defined for the macro 161 ("Replace by macro 162." and "Insert inverter to net B.") are displayed in the temporary modification candidate selector section 113.

FIG. 17 illustrates the path when "Replace by macro 162." is selected as temporary modification candidate. As shown in FIG. 17, the macro 161 is replaced by the macro 162. The path from the starting point to the destination point is activated as a result of the replacement.

FIG. 18 illustrates the path when "Insert inverter to net B." is selected as temporary modification candidate. As shown in FIG. 18, inverter 163 is inserted into the net B. The path from the starting point to the destination point is activated as a result of the insertion.

As described above, according to the present invention, it is possible to curtail the time period necessary for designing a logic circuit and modify the logic circuit with ease. Additionally, a situation where a serious major verification error hinders logic verification of other minor errors is reliably avoided to make it possible to verify the entire circuit. Still additionally, it is possible to verify the influence of a modified spot that is exerted on the logic circuit and a logic verification error that arises after an operation of modifying the circuit can be detected at the stage of verifying the data for verification.

Furthermore, when a number of circuit modifying techniques are available, it is possible to text each of the modification techniques with ease and apply an optimal modification technique so that it is no longer necessary to repeat an operation of modification and verification once the logic circuit is verified. In other words, the modification that is verified as a result of temporary modification can be reflected to the corresponding real circuit data.

Additionally, it is possible to display modification candidates at the modification candidate selector section so as to prompt the user to select one of them so that the designer can easily conduct an operation of temporary modification on a logic circuit if the designer is not an experienced designer.

As described above, the invention provides a logic verification device, a logic verification method and a logic verification computer program that can reduce the number of steps involved in designing a logic circuit particularly when the designed logic circuit is subjected to logic verification and modification at the spot where an error is detected.

What is claimed is:

1. A logic verification device comprising:
a data converter section adapted to convert circuit data to be processed for designing a logic circuit into data for verification to be processed for logic verification and vice versa;
a verifier section adapted to operate for logic verification of said data for verification; and
a temporary modifier section adapted to acquire a result of verification of said verifier section and modification candidate data corresponding to the result of verification of said verifier section and pre-selected as candidate data for modification of said data for verification and modify said data for verification on the basis of said acquired result of verification and said acquired modification candidate data.

2. A device according to claim 1, further comprising:
a modification candidate data storage section adapted to store said modification candidate data corresponding to the result of verification of said verifier section; and
a modification candidate data selector section adapted to arbitrarily select modification candidate data out of the modification candidate data stored in said modification candidate data storage section corresponding to the result of verification acquired by said temporary modifier section;
said temporary modifier section being adapted to modify said data for verification on the basis of said modification candidate data arbitrarily selected by said modification candidate data selector section.

3. A device according to claim 1 further comprising:
a modification candidate data storage section adapted to store said modification candidate data corresponding to the result of verification of said verifier section and predetermined conditions for selection;
said temporary modifier section being adapted to select modification candidate data out of the modification candidate data stored in said modification candidate data storage section on the basis of said acquired result of verification and said predetermined conditions for selection and modify said data for verification on the basis of said selected modification candidate data.

4. A device according to claim 1, further comprising:
a temporary modification-related information storage section adapted to store the modifications made to the data for verification by said temporary modifier section corresponding respectively to the modification version numbers; and
a temporary modification version number selector section adapted to select the modification of an arbitrarily selected number of version out of the modifications stored in the temporary modification-related information storage section to reflect the selected modification to said circuit data.

5. A device according to claim 1, further comprising:
a verification rule-related information storage section adapted to store verification rule-related information to be used for defining the logic verification to be made by said verifier section;
said verifier section being adapted to exclude a specific part of said data for verification from the object of verification according to said verification rule-related information.

6. A device according to claim 1, further comprising:
a verification rule-related information storage section adapted to store verification rule-related information to be used for defining the logic verification to be made by said verifier section;
said verifier section being adapted to select only the part of data for verification liable to be influenced by the modification according to said verification rule-related information when the logic verification is conducted on the data for verification modified by the temporary modifier section.

7. A loglo verification method comprising:
a data conversion step of converting circuit data to be processed for designing a logic circuit into data for verification to be processed for logic verification and vice versa;
a verification step of operating for logic verification of said data for verification; and
a temporary modification step of acquiring a result of verification of said verification step and modification candidate data corresponding to the result of verification of said verification step and pre-selected as candidate data for modification of said data for verification and modifying said data for verification on the basis of said acquired result of verification and said acquired modification candidate data.

8. A method according to claim 7, further comprising;
a modification candidate data storage step of storing said modification candidate data corresponding to the result of verification of said verification step; and
a modification candidate data selection step of arbitrarily selecting modification candidate data out of the modification candidate data stored in said modification candidate data storage step corresponding to the result of verification acquired in said temporary modification step;
said temporary modification step being adapted to modify said data for verification on the basis of said modification candidate data arbitrarily selected in said modification candidate data selection step.

9. A method according to claim 7, further comprising:
a modification candidate data storage step of storing said modification candidate data corresponding to the result of verification of said verification step and predetermined conditions for selection;
said temporary modification step being adapted to select modification candidate data out of the modification candidate data stored in said modification candidate data storage step on the basis of said acquired result of verification and said predetermined conditions for selection and modify said data for verification on the basis of said selected modification candidate data.

10. A method according to claim 7, further comprising:
a temporary modification-related information storage step of storing the modifications made to the data for verification in said temporary modification step corresponding respectively to the modification version numbers; and
a temporary modification version number selection step of selecting the modification of an arbitrarily selected number of version out of the modifications stored in the temporary modification-related information storage step to reflect the selected modification to said circuit data.

11. A method according to claim 7, further comprising:
a verification rule-related information storage step of storing verification rule-related information to be used for defining the logic verification to be made in said verification step;
said verification step being adapted to exclude a specific part of said data for verification from the object of verification according to said verification rule-related information.

12. A method according to claim 7, further comprising:
a verification rule-related information storage step of storing verification rule-related information to be used for defining the logic verification to be made in said verification step,
said verification step being adapted to select only the part of data for verification liable to be influenced by the modification according to said verification rule-related information when the logic verification is conducted on the data for verification modified in the temporary modification step.

13. A computer readable medium storing a logic verification computer program adapted to drive a computer to execute:

a data conversion step of converting circuit data to be processed for designing a logic circuit into data for verification to be processed for logic verification and vice versa;
a verification step of operating for logic verification of said data for verification; and
a temporary modification step of acquiring a result of verification of said verification step and modification candidate data corresponding to the result of verification of said verification step and pre-selected as candidate data for modification of said data for verification and modifying said data for verification on the basis of said acquired result of verification and said acquired modification candidate data.

14. A computer program according to claim 13, further comprising:
a modification candidate data storage step of storing said modification candidate data corresponding to the result of verification of said verification step; and
a modification candidate data selection step of arbitrarily selecting modification candidate data out of the modification candidate data stored in said modification candidate data storage step corresponding to the result of verification acquired in said temporary modification step;
said temporary modification step being adapted to modify said data for verification on the basis of said modification candidate data arbitrarily selected in said modification candidate data selection step.

15. A computer program according to claim 13, further comprising:
a modification candidate data storage step of storing said modification candidate data corresponding to the result of verification of said verification step and predetermined conditions for selection;
said temporary modification step being adapted to select modification candidate data out of the modification candidate data stored in said modification candidate data storage step on the basis of said acquired result of verification and said predetermined conditions for selection and modify said data for verification on the basis of said selected modification candidate data.

16. A computer program according to claim 13, further comprising:
a temporary modification-related information storage step of storing the modifications made to the data for verification in said temporary modification step corresponding respectively to the modification version numbers; and
a temporary modification version number selection step of selecting the modification of an arbitrarily selected number of version out of the modifications stored in the temporary modification-related storage step to reflect the selected modification to said circuit data.

17. A computer program according to claim 13, further comprising:
a verification rule-related information storage step of storing verification rule-related information to be used for defining the logic verification to be made in said verification step;
said verification step being adapted to exclude a specific part of said data for verification from the object of verification according to said verification rule-related information.

18. A computer program according to claim 13, further comprising:

a verification rule-related information storage step of storing verification rule-related information to be used for defining the logic verification to be made in said verification step;

said verification step being adapted to select only the part of data for verification liable to be influenced by the modification according to said verification rule-related information when the logic verification is conducted on the data for verification modified in the temporary modification step.

* * * * *

UNITED STATES PATENT AND TRADEMARK OFFICE
CERTIFICATE OF CORRECTION

PATENT NO.        : 7,131,086 B2                                          Page 1 of 1
APPLICATION NO.   : 10/915608
DATED             : October 31, 2006
INVENTOR(S)       : Junya Yamasaki et al.

It is certified that error appears in the above-identified patent and that said Letters Patent is hereby corrected as shown below:

Column 16, Line 59, change "loglo" to --logic--.

Column 17, Line 7, after "comprising" change ";" to --:--.

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,131,086 B2 |
| APPLICATION NO. | : 10/915608 |
| DATED | : October 31, 2006 |
| INVENTOR(S) | : Junya Yamasaki et al. |

It is certified that error appears in the above-identified patent and that said Letters Patent is hereby corrected as shown below:

Column 16, Line 59, change "loglo" to --logic--.

Column 17, Line 7, after "comprising" change ";" to --:--.

Signed and Sealed this

Twentieth Day of March, 2007

JON W. DUDAS
*Director of the United States Patent and Trademark Office*